United States Patent [19]

Tsunekawa et al.

[11] Patent Number: 4,712,136
[45] Date of Patent: Dec. 8, 1987

[54] SIGNAL PROCESSING CIRCUIT OF SOLID STATE IMAGE PICKUP DEVICE

[75] Inventors: Tokuichi Tsunekawa, Yokohama; Yuichi Sato, Tokyo, both of Japan

[73] Assignee: Canon Kabushiki Kaisha, Tokyo, Japan

[21] Appl. No.: 906,273

[22] Filed: Sep. 10, 1986

[30] Foreign Application Priority Data

Sep. 12, 1985 [JP] Japan .................. 60-202437

[51] Int. Cl.⁴ .................................. H04N 5/335
[52] U.S. Cl. ..................... 358/213.15; 358/213.19
[58] Field of Search ............... 358/213.15, 213.19

[56] References Cited

U.S. PATENT DOCUMENTS

| | | | |
|---|---|---|---|
| 4,500,924 | 2/1985 | Ohta | 358/213.19 |
| 4,511,804 | 4/1985 | Ozawa | 358/213.15 |
| 4,600,843 | 7/1986 | Kizu | 358/213.15 |
| 4,623,927 | 11/1986 | Hoshino | 358/213.19 |
| 4,635,126 | 1/1987 | Kinoshita | 358/213.19 |

Primary Examiner—Michael A. Masinick
Attorney, Agent, or Firm—Fitzpatrick, Cella, Harper & Scinto

[57] ABSTRACT

There is a solid state image pickup device having a signal voltage output circuit to output a charge signal as voltage information through a charge-voltage converter and a correction voltage output circuit to generate a reference voltage into which no signal charge is input and which has a circuit arrangement similar to the signal voltage output circuit. The invention intends to provide a signal processing circuit of such a solid state image pickup device in which the output of the correction voltage output circuit is provided with a time constant circuit, and this signal processing circuit consists of a differential amplifier to amplify the difference between the correction voltage output derived through the time constant circuit and the output of the signal voltage output circuit.

15 Claims, 5 Drawing Figures

SIGNAL PROCESSING CIRCUIT OF SOLID STATE IMAGE PICKUP DEVICE

BACKGROUND OF THE INVENTION

1. Field of the Invention

The present invention relates to a signal processing circuit of a solid state image pickup device in which the noise of the signal voltage output of the solid state image pickup device can be minimized and the drift of the signal output by the thermal influence in the device can be also suppressed.

2. Related Background Art

Hitherto, a solid state image pickup device is provided with: a signal voltage output circuit to output a charge signal as voltage information through a charge-voltage converter; and a correction voltage output circuit to generate a reference voltage into which no signal charge is input and which has a circuit arrangement similar to the signal voltage output circuit. This solid state image pickup device, in general, uses the driving system such that the noise of the in-phase component is eliminated by obtaining the difference between the output signal of the correction voltage output circuit and the output signal of the signal voltage output circuit. When the dynamic range of the light information is about 10 to $10^2$, a considerable large signal output can be also obtained by the conventional driving system, so that it can be used for the automatic focus control of the camera and for the signal process of the facsimile apparatus and the like.

This point will be further described in detail hereinbelow.

FIG. 1 is a graph showing time-dependent changes of a signal voltage output $V_{os}$ and a correction voltage output $V_{dos}$ after a power source was applied to the solid state image pickup device. According to the actual measured data, even after tens of minutes or more have elapsed, a fluctuation above a few millivolts per minute still remains. Therefore, this fluctuation fairly obstructs the measurement with a high degree of accuracy over a wide dynamic range.

FIG. 2 is a differential amplifier which has conventionally been used to eliminate the in-phase noises such as the time-dependent change and the like. In the diagram, reference character SP denotes a solid state image pickup device; $R_{10}$ to $R_{13}$ are operational resistors; and OP is an operational amplifier. These components constitute the differential amplifier between the signal voltage output $V_{os}$ and the correction voltage output $V_{dos}$. The signal of $V_{dos} - V_{os}$ is output to the output terminal of this differential amplifier. Therefore, the influence by the time-dependent change, for example, as shown in FIG. 1 can be eliminated.

However, when the dynamic range of the light information is above $10^2$ to $10^3$, the influences of the respective random noises of the signal voltage output circuit and correction voltage output circuit cause a problem. If the difference between the correction voltage output and the signal voltage output is simply obtained as in the conventional system, the noises will in turn increase, causing the S/N ratio to deteriorate.

SUMMARY OF THE INVENTION

It is an object of the present invention to solve the foregoing drawbacks.

Another object of the invention is to provide a signal processing circuit of a solid state image pickup device in which the correction voltage output is provided with a time constant circuit adapted to respond the fluctuation in signal voltage which is sufficiently longer than the period of the read clock pulse of the signal output of the solid state image pickup device and which is caused by the thermal influence in the device, and the difference between the correction voltage output which is derived through the time constant circuit and the signal voltage output is obtained, thereby deriving the high-stable signal output with less noise.

To accomplish the above objects, according to an embodiment of a signal processing circuit of the invention, in the solid state image pickup device having a signal voltage output circuit to output a charge signal as voltage information through a charge voltage converter and a correction voltage output circuit to generate a reference voltage into which no signal charge is input and which has a circuit arrangement similar to the signal voltage output circuit, the output of the correction voltage output circuit is provided with a time constant circuit and this signal processing circuit consists of a differential amplifier to amplify the difference between the correction voltage output which is derived through the time constant circuit and the output of the signal voltage output circuit.

Therefore, it is possible to obtain the signal processing circuit which is hardly influenced by the random noises and which can also eliminate the in-phase noise.

The above and other objects and features of the present invention will become apparent from the following detailed description and the appended claims with reference to the accompanying drawings.

DETAILED DESCRIPTION OF THE PREFERRED EMBODIMENTS

The present invention will be described in detail hereinbelow with respect to embodiments shown in FIGS. 3, 4A, and 4B.

Figure 1:
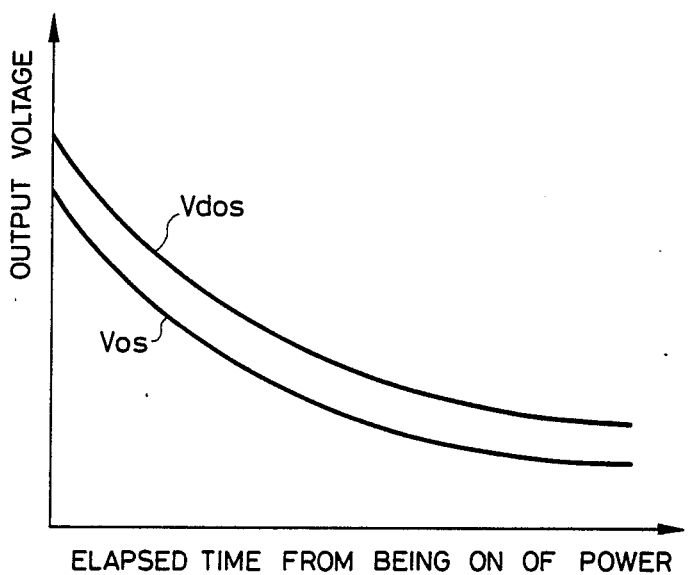
FIG. 1 is a graph showing output characteristics.
Figure 2:
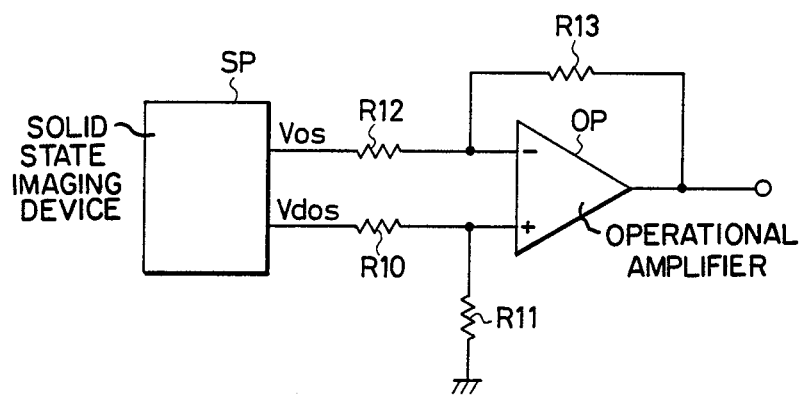
FIG. 2 is an arrangement diagram of a conventional differential amplifier.
Figure 3:
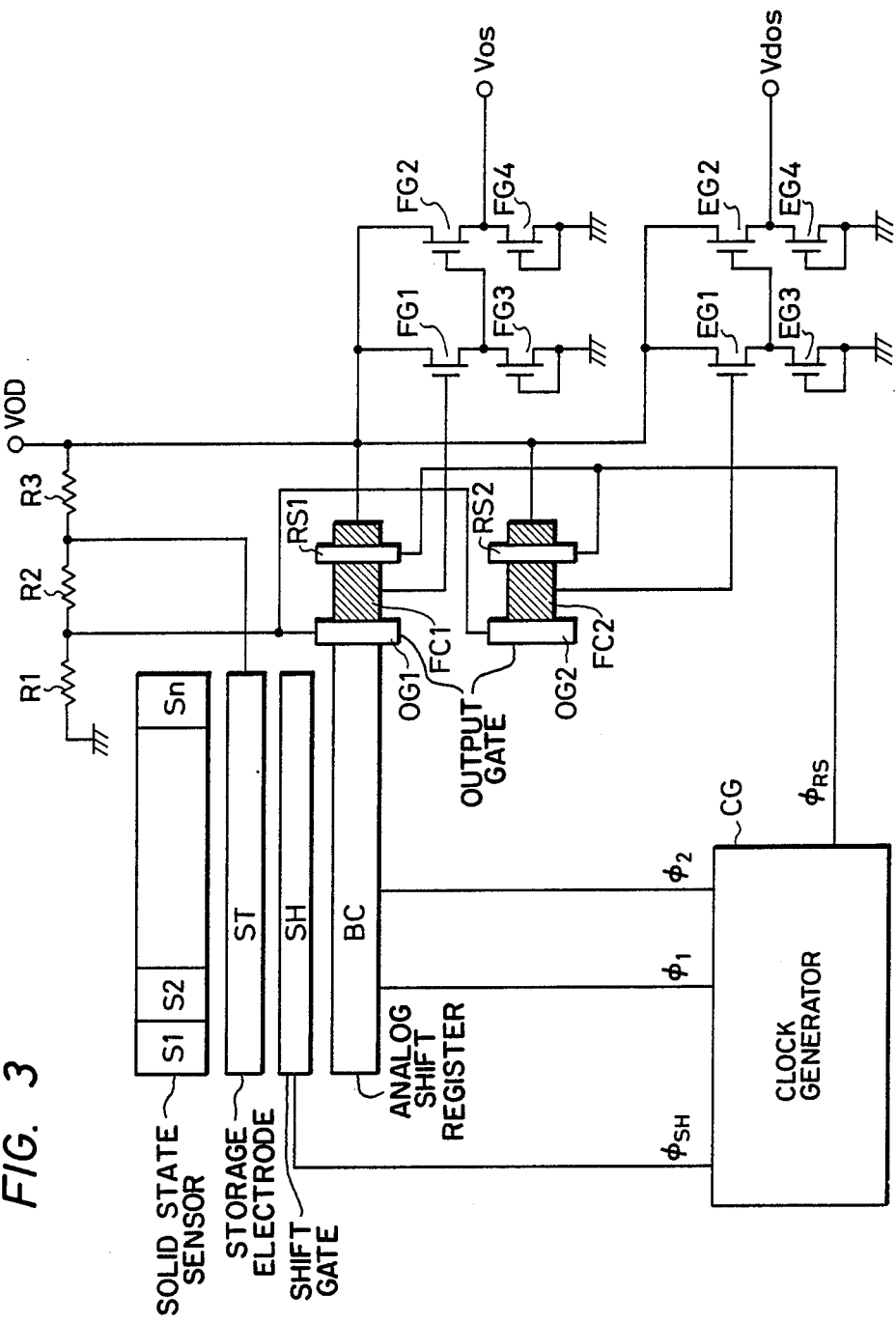
FIG. 3 is an arrangement diagram of a solid state image pickup device.

First, FIG. 3 is an example of an ordinary solid state image pickup device consisting of a CCD. In the diagram, reference characters $S_1$ to $S_n$ denote photoelectric converting units consisting of $P_n$ photodiodes and the like; ST is a storage electrode; SH a shift gate; BC an analog shift register to transfer signal charges which are driven by clock pulses $\phi_1$ and $\phi_2$; $OG_1$ and $OG_2$ output gates; $FC_1$ and $FC_2$ floating capacitors to read out the charge information; and $RS_1$ and $RS_2$ reset gates. The signals read out through the floating capacitors $FC_1$ and $FC_2$ are voltage-converted by a signal voltage output circuit comprising transistors $FG_1$ to $FG_4$ and by a correction voltage output circuit comprising transistors $EG_1$ to $EG_4$, respectively, so that the signal voltage output $V_{os}$ and the correction voltage output $V_{dos}$ are generated. $R_1$ to $R_3$ denote bleeder resistors to apply reference voltages to the storage gate ST and output gates $OG_1$ and $OG_2$.

CG represents a clock generator to supply clock pulses $\phi_1$, $\phi_2$, $\phi_{SH}$, $\phi_{RS}$, and the like.

In such a circuit arrangement, the random noises of such levels that are not negligible are generated from the output gates $OG_1$ and $OG_2$, floating capacitors $FC_1$ and $FC_2$, reset gates $RS_1$ and $RS_2$, and source follower circuits $FG_1$ to $FG_4$ and $EG_1$ to $EG_4$ which constitute a charge-voltage converting unit of the solid state image pickup device SP.

Figure 4A:
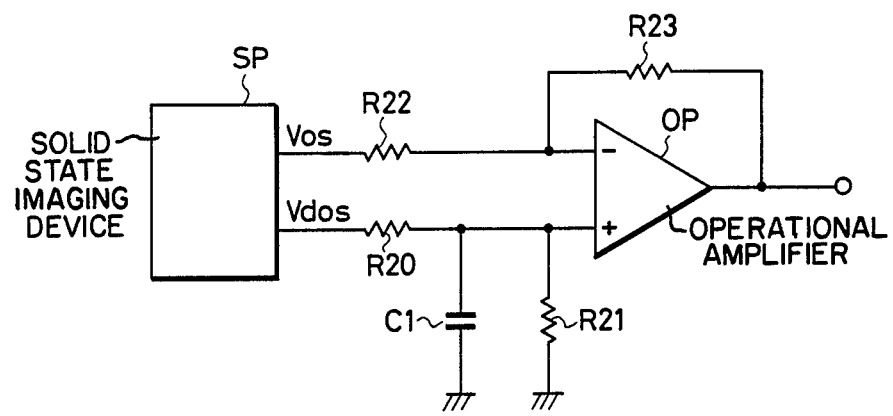
FIGS. 4A and 4B are arrangement diagrams showing embodiments of a signal processing circuit of a solid state image pickup device according to the present invention.
Figure 4B:
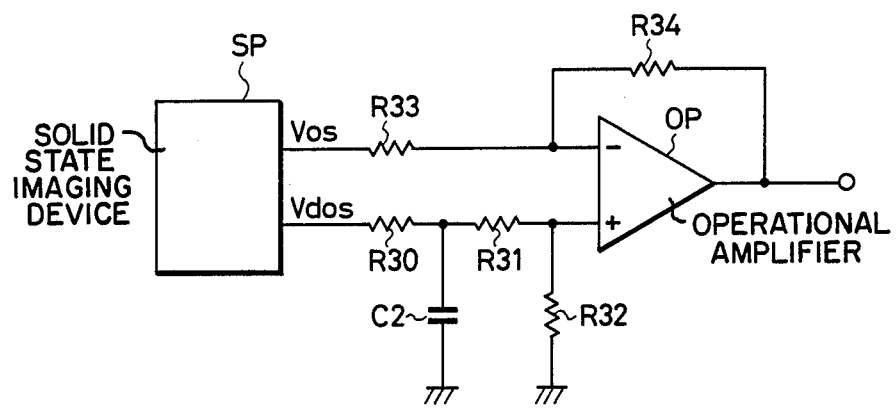

FIGS. 4A and 4B are examples of a signal processing circuit of a high-stable and low-noise solid state image pickup device according to the invention. In the diagrams, SP denotes the solid state image pickup device shown in FIG. 3; OP is an operational amplifier; $R_{20}$ to $R_{23}$ and $R_{30}$ to $R_{34}$ indicate operational resistors; and $C_1$ and $C_2$ are capacitors for time constants. In FIG. 4A, a time constant circuit to reduce the random noises of the correction voltage output $V_{dos}$, in other words, a low pass filter is constituted by the resistor $R_{20}$ and capacitor $C_1$. In FIG. 4B, a time constant circuit (i.e., low pass filter) is constituted by the resistor $R_{30}$ and capacitor $C_2$.

In these time constant circuits, the random noises appearing in the correction voltage output $V_{dos}$ are averaged and smoothed. For example, when the signal of 1 MHz is used as the clock pulse, the influence by the random noises can be eliminated by setting time constants of the time constant circuits to the values which are thousands or more times as long as the periods of the signal outputs of the time constant circuits, namely, about a few milliseconds to tens of milliseconds.

On the other hand, for the drift of the signal by the thermal influence in the device, it has been found from the actual measurement that the drift can be sufficiently followed if the signal processing circuit responds for about tens of milliseconds. By setting the time constants to about those values, the random noises can be eliminated and the in-phase drift can be also removed. Therefore, the high-stable signal output having an excellent S/N ratio can be derived.

As described above, according to the signal processing circuit of the solid state image pickup device of the invention, the high-stable signal output having an excellent S/N ratio can be derived by a simple circuit arrangement.

What is claimed is:

1. A signal processing circuit of a solid state image pickup device having a signal voltage output circuit for outputting a charge signal as voltage information through a charge voltage converter and a correction voltage output circuit for generating a reference voltage into which no signal charge is input and which has a circuit arrangement similar to said signal voltage output circuit, wherein an output of said correction voltage output circuit is provided with a time constant circuit, and said signal processing circuit has a circuit for differentially amplifying a correction voltage output which is derived through said time constant circuit and an output of said signal voltage output circuit.

2. A signal processing circuit according to claim 1, wherein said time constant circuit consists of a resistor and a capacitor.

3. A signal processing circuit according to claim 1, wherein a time constant of said time constant circuit is sufficiently longer than a period of a read clock pulse of the signal output.

4. A signal processing apparatus comprising:
    (a) photoelectric converting means for converting light information into an electric signal, said converting means being arranged on a semiconductor substrate;
    (b) first output means whose input is connected to said photoelectric converting means and which outputs the electric signal of the photoelectric converting means;
    (c) second output means which is arranged on said semiconductor substrate and which has substantially the same input/output characteristics as those of said first output means;
    (d) a high-band cut filter for cutting out the high frequency components in an output of said second output means; and
    (e) arithmetic operating means for arithmetically operating an output of said first output means and an output of said high-band cut filter.

5. A signal processing apparatus according to claim 4, wherein said photoelectric converting means includes an image sensor for converting an optical image into a serial electric signal.

6. A signal processing apparatus according to claim 5, wherein said image sensor includes a line sensor for detecting a line image.

7. A signal processing apparatus according to claim 4, wherein said first output means includes an amplifier.

8. A signal processing apparatus according to claim 7, wherein said first output means converts a charge signal into a voltage signal.

9. A signal processing apparatus according to claim 4, wherein said second output means has substantially the same constitution as that of the first output means excluding that an input is not connected to said photoelectric converting means.

10. A signal processing apparatus according to claim 4, wherein said high-band cut filter includes a low pass filter.

11. A signal processing apparatus according to claim 10, wherein said low pass filter includes a time constant circuit.

12. A signal processing apparatus according to claim 11, further having a signal source for supplying periodic read clock pulses to said first and second output means.

13. A signal processing apparatus according to claim 12, wherein said time constant circuit has a time constant which is sufficiently longer than a period of said read clock pulse.

14. A signal processing apparatus according to claim 4, wherein said arithmetic operating means includes subtracting means for performing a subtraction between an output of said first output means and an output of said high-band cut filter.

15. A signal processing apparatus according to claim 14, wherein said subtracting means includes a differential amplifier.

* * * * *